United States Patent [19]

Goebel et al.

[11] Patent Number: 5,212,425
[45] Date of Patent: May 18, 1993

[54] ION IMPLANTATION AND SURFACE PROCESSING METHOD AND APPARATUS

[75] Inventors: Dan M. Goebel, Tarzana; Jesse N. Matossian, Woodland Hills, both of Calif.

[73] Assignee: Hughes Aircraft Company, Los Angeles, Calif.

[21] Appl. No.: 595,122

[22] Filed: Oct. 10, 1990

[51] Int. Cl.$^5$ .............................................. H05H 1/24
[52] U.S. Cl. ........................... 315/111.21; 315/111.81; 315/344; 313/231.31
[58] Field of Search ..................... 315/111.21, 111.81, 315/111.41, 344; 313/231.31; 250/423 R

[56] References Cited

U.S. PATENT DOCUMENTS

| | | | |
|---|---|---|---|
| 3,207,994 | 9/1965 | Theodore et al. | 328/67 |
| 4,291,255 | 9/1981 | Alexeff | 315/344 X |
| 4,596,945 | 6/1985 | Schumacher et al. | 315/344 |
| 4,764,394 | 8/1988 | Conrad | 427/38 |
| 4,978,889 | 12/1990 | Schumacher | 315/111.21 |

FOREIGN PATENT DOCUMENTS 1233958 2/1967 Fed. Rep. of Germany .
WO89/12905 12/1989 PCT Int'l Appl. .

OTHER PUBLICATIONS

IEEE Conference Record, Nineteenth Power Modulator Symposium, San Diego, CA Jun. 1990, pp. 454-458, Farrell: "Generation of Closely-Spaced, Doublet, CFA Cathode Pulses with a Line-Type Modulator".
J. Pelletier and Y. Arnal, "New Application for Multipolar Plasmas: High-Temperature Treatment of Materials", Rev. Sci. Instrum. 55(10), Oct. 1984, American Institute of Physics (1984), pp. 1636-1638.

*Primary Examiner*—Eugene R. LaRoche
*Assistant Examiner*—Do Hyun Yoo
*Attorney, Agent, or Firm*—V. D. Duraiswamy; W. K. Denson-Low

[57] ABSTRACT

A capacitor is charged to a high potential or voltage from a power source. A plasma switch, preferably a CROSSATRON modulator switch, is periodically closed and opened to discharge the capacitor into an object for implantation with ions from a plasma in a plasma source ion implantation apparatus. The periodic discharge results in the application of high voltage negative pulses to the object, causing ions from the plasma to be accelerated toward, and implanted into the object. A pulse transformer is preferably provided between the plasma switch and capacitor, and the object to step up the voltage of the pulses and enable the plasma switch to operate at lower voltage levels. The plasma switch enables high duty factor and power operation, and may be combined with arc detection and suppression circuitry to prevent arcing between the object and plasma. A second power source, capacitor, and plasma switch may be provided to apply positive pulses to the object in alternation with the negative pulses to cause generation of the plasma, or to accelerate electrons into the object for performing thermally assisted ion implantation, surface annealing, and the like.

39 Claims, 7 Drawing Sheets

ION IMPLANTATION AND SURFACE PROCESSING METHOD AND APPARATUS

BACKGROUND OF THE INVENTION

1. Field of the Invention

The present invention relates to an ion implantation and surface processing apparatus including an improved pulse modulator for applying electrical pulses to an object for plasma source ion implantation (PSII).

2. Description of the Related Art

PSII is an ion implantation technique which circumvents the line-of-sight restriction inherent in conventional ion implantation. The basic technique is disclosed in U.S. Pat. No. 4,764,394, entitled "METHOD AND APPARATUS FOR PLASMA SOURCE ION IMPLANTATION", issued Aug. 16, 1988, to J. Conrad (University of Wisconsin Alumni Association); and in an article entitled "Plasma source ion-implantation technique for surface modification of materials", by J. Conrad, in the Journal of Applied Physics, vol. 62, no. 11, 1 Dec. 1987, pp. 4591–4596. Ion implantation into surfaces of three-dimensional target objects is achieved by forming a plasma about the target within an enclosing container and applying repetitive pulses of negative high voltage between the target and the conductive walls of the container. Ions from the plasma are driven into the target object surface from all sides simultaneously and omnidirectionally without the need for manipulation of the target object. The plasma may be formed of a neutral gas introduced into the evacuated container and ionized therein with ionizing radiation so that a constant source of plasma is provided which surrounds the target object during the implantation process. Significant increases in the surface hardness and wear resistance characteristics of various materials are obtained with ion implantation using the PSII technique.

Figure 1:
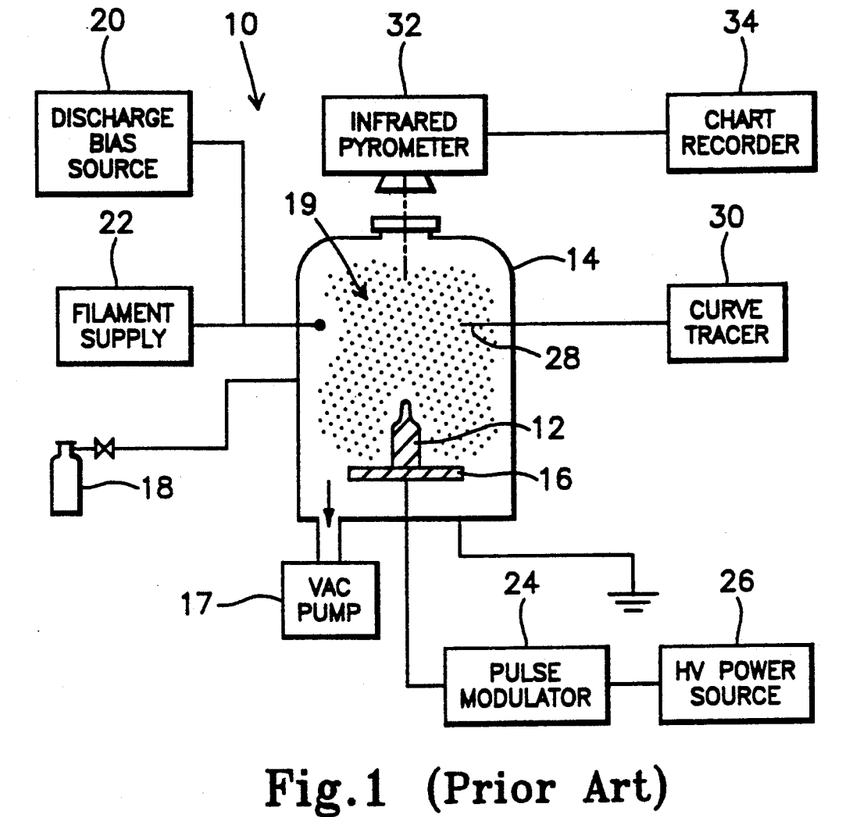
FIG. 1 is a diagram illustrating a conventional plasma source ion implantation (PSII) apparatus.

An apparatus for performing PSII as taught by Conrad is illustrated in FIG. 1 and generally designated as 10. An object 12 which is to be implanted with ions is supported in a container or chamber 14 on a target stage or support 16. The container 14 is electrically grounded, and evacuated by a vacuum pump 17 to a pressure on the order of $2 \times 10^{-4}$ Torr. A working gas which may be, for example, nitrogen, helium, or argon, is supplied from a tank 18 into the container 14. The gas is ionized to produce a plasma 19 by means of filament discharge using voltages from a discharge bias source 20 and a filament supply 22. The plasma density can be varied between approximately $10^6$ and $10^{11}$ ions/cm$^3$ by adjusting the filament current and bias applied by the sources 20 and 22. A pulse modulator 24 which is supplied with a direct current voltage or potential from a high voltage power source 26 applies negative pulses to the object 12 through the stage 16 of up to approximately 100 kV. A Langmuir probe 28 is used to measure the plasma density and electron temperature, which are displayed on a curve tracer 30. Target temperatures during implantation are monitored by an infrared pyrometer 32, and recorded on a chart recorder 34.

Figure 2:
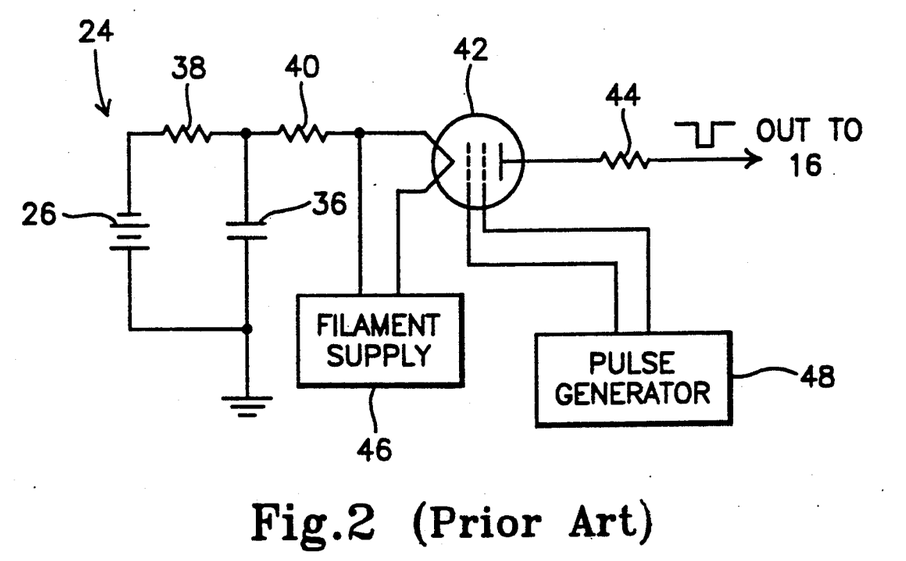
FIG. 2 is an electrical schematic diagram illustrating a conventional pulse modulator.

The high voltage negative pulses applied from the pulse modulator 24 to the object 12 attract the positively charged ions from the plasma 19 and cause them to be accelerated toward and implanted into the object 12. A schematic diagram of a conventional pulse modulator 24 is shown in FIG. 2. A capacitor 36 is negatively charged from the power source 26 through a resistor 38. The negatively charged end (connected to the resistor 38) of the capacitor 36 is connected through a resistor 40 to the cathode of a high voltage "hard" vacuum tube 42. The anode of the vacuum tube 42 is connected through a resistor 44 to the stage 16 and thereby to the object 12. Further illustrated is a filament supply 46 for the vacuum tube 42.

The tube 42 is normally turned off or electrically non-conductive, thereby electrically disconnecting the capacitor 36 from the object 12. In response to pulses from a pulse generator 48 applied to the control grids of the tube 42, the tube 42 becomes conductive for the duration of each pulse and connects the capacitor 36 to the object 12. This causes the capacitor 36 to discharge through the tube 42 into the object 12, resulting in the application of a high voltage negative pulse to the object. The capacitor 36 recharges between pulses to provide a high level of discharge current.

In PSII as disclosed in the above reference patent to Conrad, the implantation time is independent of the object size. The implantation time depends only on the duty factor and power handling capability of the pulse modulator, without excessively heating the object. For a typical plasma ion current density of 1 mA/cm$^2$, implantation of any size object at a maximum dose of $10^{18}$ ions/cm$^2$ (typically corresponding to stoichiometry) will require over 44 hours, using the conventional pulse modulator 24 utilizing the hard vacuum tube 42, and operating at a duty factor of 0.1 %. This is impractical for cost-effective use of PSII in a manufacturing environment. A factor of ten reduction in the implantation time, corresponding to an increase of at least ten times in the duty factor and power-handling capability of the pulse modulator 24 (for fixed plasma density), is required to make PSII processing at $10^{18}$ ions/cm$^2$ dose cost-effective. This must be accomplished by increasing the duty factor and power handling capability of the pulse modulator.

The conventional pulse modulator 24 has several limitations restricting its ability to achieve these goals. The conventional vacuum tube 42 of the pulse modulator 24 is connected in a "floating" circuit arrangement, and must be very large and thereby expensive since it must hold off the full implantation voltage between pulses. For PSII operation at voltages above 100 kV, it is very difficult to obtain vacuum tubes with such a high voltage rating.

For implantation of large objects at high ion dose (approximately $10^{18}$/cm$^2$), high duty factor (average power) pulse modulator operation is required. For high duty factor operation using the hard vacuum tube 42, a large cooling system (not shown) is required to dissipate the heat generated due to the high voltage drop across the tube. In addition, the vauuum tube, filament power supply, and grid driver circuitry must float at the full implantation voltage during operation, requiring additional costly isolation transformers to be provided for the circuit. Floating the vacuum tube and control circuitry at high voltage makes it very complicated to implement arc-suppression circuitry in the apparatus to protect the object from being damaged in the event of an arc. In addition, vacuum tubes have short operating lifetimes due to their inherent hot cathode operation, and generate large amounts of undesirable x-rays and electromagnetic interference.

SUMMARY OF THE INVENTION

The present invention overcomes the limitations of the conventional PSII technique as disclosed in the above referenced patent to Conrad by providing an ion implantation and surface processing method and apparatus including an improved pulse modulator having greatly increased duty factor and power handling capabilities over conventional PSII apparatus including pulse modulators utilizing hard vacuum tubes.

In accordance with the present invention, a capacitor is charged to a high potential or voltage from a power source. A plasma switch, preferably a CROSSATRON, Modulator Switch, is periodically closed and then opened to discharge part of the energy stored in the capacitor into an object for implantation with ions from a plasma in a plasma source ion implantation apparatus. The periodic discharge results in the application of high voltage negative pulses to the object, causing ions from the plasma to be accelerated toward, and implanted into the object. A pulse transformer is preferably provided between the plasma switch/capacitor and the object to step up the voltage of the pulses and enable the plasma switch to operate at lower voltage levels. The plasma switch enables high duty factor and power operation, and may be combined with arc detection and suppression circuitry to prevent arcing between the object and plasma. A second power source, capacitor, and plasma switch may be provided to apply positive pulses to the object in alternation with the negative pulses to cause generation of the plasma, or to accelerate electrons into the object for performing surface processing such as thermally assisted ion implantation, surface annealing, and the like.

The CROSSATRON modulator switch is capable of operating with a duty factor substantially in excess of ten times higher than that of a hard vacuum tube, and with much greater power handling capability. The CROSSATRON switch may be operated in a grounded cathode, rather than a floating configuration, therefore facilitating arc suppression and protection of expensive objects during implantation. The CROSSATRON switch has a very low forward voltage drop, thereby dissipating a relatively small amount of power in the closed or conducting state and generating very little heat. These factors enable ion implantation of large objects to be economically performed on a commercial production basis.

These and other features and advantages of the present invention will be apparent to those skilled in the art from the following detailed description, taken together with the accompanying drawings, in which like reference numerals refer to like parts.

DETAILED DESCRIPTION OF THE INVENTION

The present invention provides an ion implantation and surface processing method and apparatus which enable improved performance and capabilities not possible with the conventional apparatus disclosed by Conrad. The present apparatus has the general configuration illustrated in FIG. 1, including the container or chamber 14 for enclosing the object 12 for ion implantation and surface processing, and the elements described above for generating the plasma 19 which surrounds the object 12.

Figure 3:
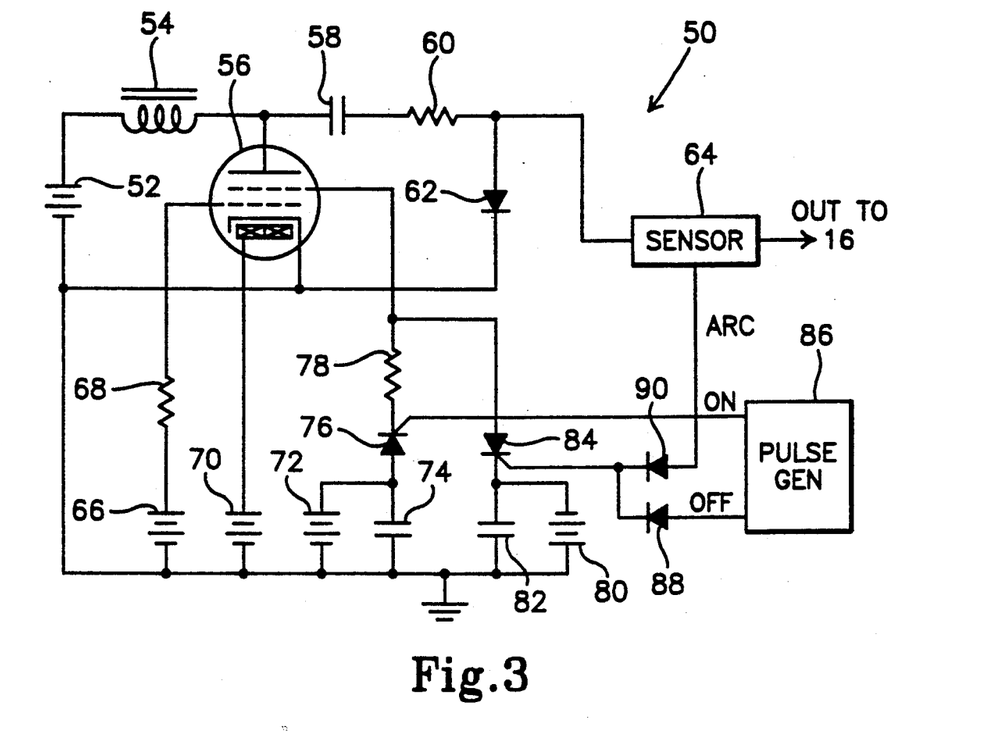
FIG. 3 is an electrical schematic diagram illustrating an improved pulse modulator which constitutes an element of an ion implantation and surface processing apparatus embodying the present invention.

As illustrated in FIG. 3, a pulse modulator which replaces the prior art pulse modulator 24 in the present apparatus is generally designated as 50, and includes a source 52 of high voltage or potential on the order of 100 kV. The negative end of the source 52 is grounded, whereas the positive end of the source 52 is connected through a surge limiting series impedance or inductor 54 to the anode of a plasma switch 56. The switch 56 is preferably a CROSSATRON modulator switch, but may be embodied by any other applicable type of plasma switch within the scope of the invention. The CROSSATRON modulator switch is disclosed in U.S. Pat. No. 4,596,945, entitled "MODULATOR SWITCH WITH LOW VOLTAGE CONTROL", issued June 24, 1986, to R. Schumacher. CROSSATRON is a trademark of the Hughes Aircraft Company, the assignee of the present invention as well as the patent to Schumacher.

The cathode of the switch 56 is grounded. The anode of the switch 56 is further connected through a capacitor 58 and resistor 60 to the anode of a diode 62. The cathode of the diode 62 is connected to ground. The anode of the diode 62 is further connected through a current sensor 64 to the stage 16 shown in FIG. 1, and thereby to the object 12 for ion implantation.

Further illustrated in FIG. 3 are a power source 66 and resistor 68 which apply a voltage of approximately 500 V to the keeper grid of the switch 56. A power source 70 provides a reservoir heater voltage of approximately 2.5 V. A power source 72 and capacitor 74 apply a voltage of approximately 1 kV to the control grid of the switch 56 through a thyristor 76 and resistor 78 to turn on or close the switch 56. A power source 80 and capacitor 82 apply a voltage of approximately −400 V to the control grid of the switch 56 through a thyristor 84. A timing pulse generator 86 applies ON pulses to the gate of the thyristor 76, and OFF pulses to the gate of the thyristor 84 through a diode 88. The sensor 64 is constructed to apply ARC pulses to the gate of the thyristor 84 through a diode 90.

It will be noted that the plasma switch 56 is connected in parallel across the power source 52, and that the capacitor 58 is connected in series with the object 12 across the switch 56.

In operation, the capacitor 58 charges through the inductor 54, resistor 60, and diode 62 when the switch 56 is in an open or non-conductive state. More specifically, the end of the capacitor 58 which is connected to the anode of the switch 56 is charged positive with respect to ground. Closing of the switch 56 has the effect of connecting the positive end of the capacitor 58 to ground through the low resistance path of the electrically conducting switch 56. The end of the capacitor 58 which is connected to the resistor 60 becomes negative with respect to ground, thereby reverse biasing the diode 62. The capacitor 58 discharges through the resistor 60 into the object 12, resulting in the application of a negative pulse to the object 12 to affect ion implantation as described above. Opening of the switch 56 terminates the negative pulse to the object 12.

Figure 4:
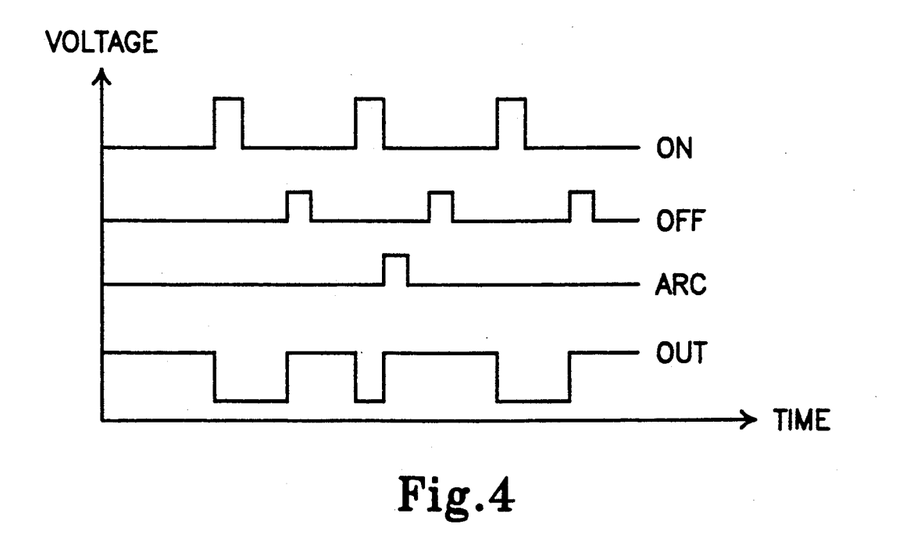
FIG. 4 is a timing diagram illustrating the operation of the pulse modulator of FIG. 3.

The operation of the timing pulse generator 86 is illustrated in FIG. 4. The leading edge of each ON pulse turns on the thyristor 76, thereby gating the 1 kV voltage from the power source 72 to the control grid of the switch 56 to turn on or close the switch. The OFF pulses alternate with the ON pulses, such that the leading edge of each OFF pulse gates the −400 V voltage from the power source 82 to the control grid of the switch 56, thereby turning off or opening the switch. The switch 56 is closed or electrically conductive during the periods between the leading edges of the ON and OFF pulses, thereby resulting in the capacitor 58 periodically charging from the source 52 and discharging into the object 12. As illustrated in FIG. 4, negative pulses OUT are applied to the object 12 during the periods when the switch 56 is closed.

Although a single capacitor 58 is shown in the drawing for simplicity of illustration, a large bank of capacitors will generally be employed in a practical application to provide the required discharge current. It will be understood, however, that if the power source 52 where made large enough to provide sufficient pulse current on a continuous basis, the capacitor 58 would be unnecessary, and the switch 56 could directly connect and disconnect the power source 52 and the object 12 for application of the implantation pulses.

The sensor 64 is designed to sense or detect current flow therethrough in excess of a predetermined value above which arcing between the object 12 and plasma 19 would be imminent. In response to detection of an imminent arcing condition, the sensor 64 feeds an ARC pulse to the thyristor 84 through the diode 90. The leading edge of an ARC pulse causes the switch 56 to open immediately, terminate discharge of the capacitor 58 into the object 12, and thereby suppress the imminent arcing condition. Arc detection and suppression circuitry as presently described is commercially available for the CROSSATRON modulator switches manufactured by the Hughes Aircraft Company, and is capable of opening a CROSSATRON switch within one microsecond of imminent arc detection. Arc detection and suppression are facilitated since the cathode of the plasma switch 56 is grounded, rather than floating as with the hard vacuum tube 42 illustrated in FIG. 2.

FIG. 4 illustrates three ON pulses and three OFF pulses. No ARC pulse is shown as being generated between the first ON pulse and the first OFF pulse. Thus, the first OUT pulse as applied to the object 12 has a normal period or duration. An ARC pulse is illustrated as being generated between the second ON pulse and the second OFF pulse. The leading edge of the ARC pulse causes the switch 56 to open immediately, and the second OUT pulse to have a duration which is shorter than normal. No ARC pulse is generated between the third ON and OFF pulses, and the third OUT pulse has a normal duration.

Figure 5:
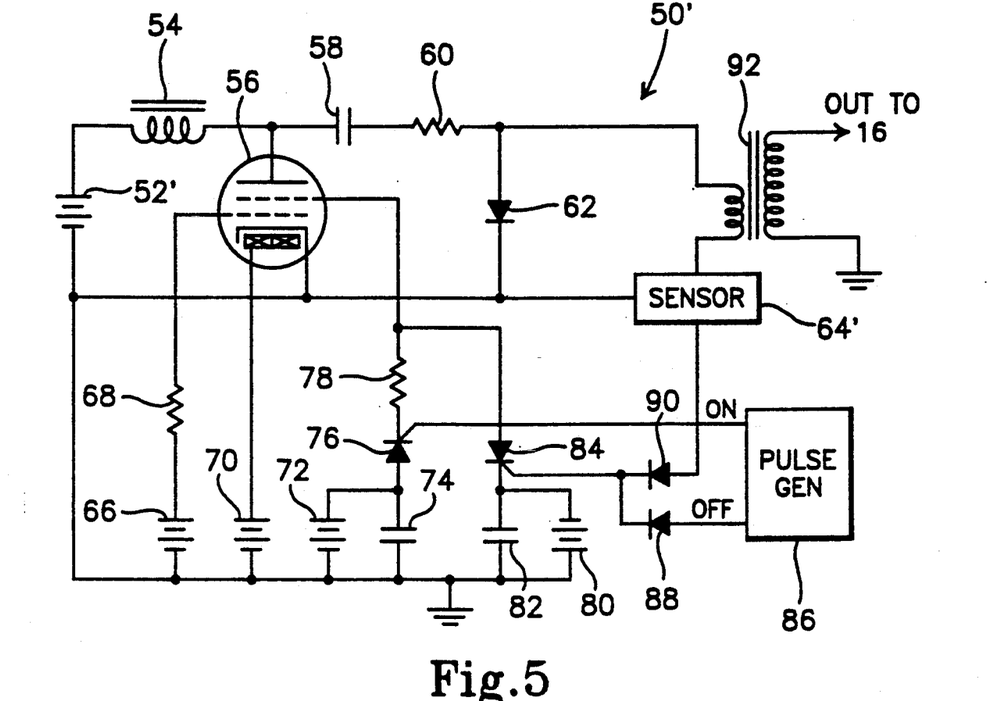
FIG. 5 is an electrical schematic diagram illustrating a modified pulse modulator embodying the invention which is additionally provided with a pulse transformer.

FIG. 5 illustrates a modified pulse modulator 50' embodying the present invention, with like elements designated by the same reference numerals used in FIG. 3, and corresponding but modified elements designated by the same reference numerals primed. The pulse modulator 50' differs from the pulse modulator 50 in that it additionally includes a pulse transformer 92 for stepping up the voltage of the pulses applied to the object 12. More specifically, a power source 52' may be constructed to provide a voltage on the order of 50 kV. Where the transformer 92 has a step-up ratio of 2.5:1, the pulse modulator 50' will apply pulses with a voltage of over 120 kV to the object 12.

The pulse transformer 92 enables the switch 56 to operate at a lower voltage than in the modulator 50. A CROSSATRON modulator switch which may be incorporated directly into the modulator 50' is commercially available from the Hughes Aircraft Company under product designation 8454H. This particular switch is capable of continuous operation at 50 kV. The rise and fall times of the current switch has a forward voltage drop of less than 500 V, and will dissipate a maximum of 2500 W of power. The heat generated during operation may be removed by a small fan. The switch is capable of 750 A peak current, 50% duty factor, pulse widths in excess of one millisecond, and an average power capacity in excess of 250 kW. These capabilities are substantially in excess of the requirements for large scale, commercial PSII application.

A current sensor 64' is connected in the primary winding of the pulse transformer 92, and may therefore have a lower voltage rating than the sensor 64. The transformer 92 is further advantageous in that it provides electrical isolation between the other components of the pulse modulator 50' and the high voltage applied to the object 12. The pulse modulator 50' may be adapted to apply positive, rather than negative, pulses to the object 12 merely by reversing the connections to the secondary winding of the transformer 92 if desired.

The apparatus illustrated in FIG. 5 was fabricated and tested for implantation of nitrogen ions using negative pulses applied to a steel object 12. A nitrogen plasma was produced in a plasma chamber 14 which was 1.22 meters in diameter and 1.22 meters long. With the plasma switch 56 operating at 1% duty factor and at an input voltage of 35 kV, an implantation voltage of 75 kV was applied to the object 12, suitable for ion implantation of nitrogen into the steel object 12 with collection of 5 amperes of ion current.

Figure 6:
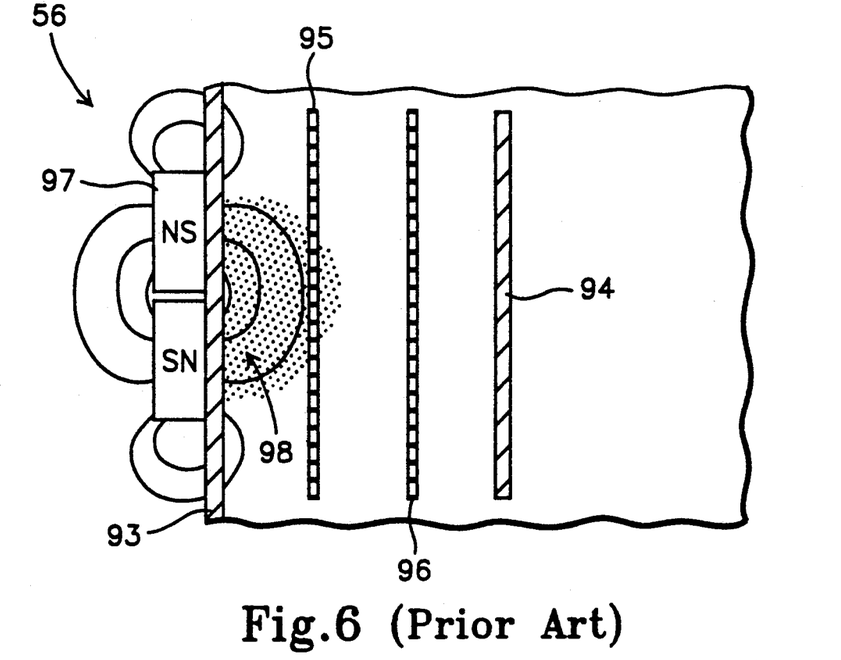
FIG. 6 is a simplified cross-sectional view of a CROSSATRON modulator switch which constitutes a preferred element of the present pulse modulator.

FIG. 6 illustrates the configuration of a CROSSATRON modulator switch which is preferably employed as the plasma switch 56. The CROSSATRON is a cold cathode, crossed-magnetic-field plasma discharge switch, and is based upon a crossed-field discharge in a four element, coaxial system consisting of a cold cathode 93, an anode 94, a keeper grid 95 and a control grid 96 disposed between the cathode 93 and anode 94. Charges for conduction are generated by a plasma discharge near the cathode 93. The plasma is produced by a crossed-field cold cathode discharge in a gap located between the keeper grid 95 (which serves as an anode for the local crossed-field discharge) and the cathode 93. The gap is magnetized with a cusped field supplied by permanent magnets 97 attached to the outside of the switch.

A source plasma 98 is generated by pulsing the potential of the keeper grid to a level above 500 V for a few microseconds to establish a crossed-field discharge. When equilibrium is reached, the keeper grid potential drops to the low discharge level about 500 V above the potential of the cold cathode 93. With the control grid 96 remaining at the cathode potential, the switch 56 remains open and the full anode voltage appears across the vacuum gap between the control grid 96 and anode 94.

The switch 56 is closed by releasing the control grid 96 potential, or by pulsing it momentarily above the 500 V plasma potential (1 kV in the present example). This allows plasma 98 to flow through the keeper grid 95 and control grid 96 to the anode 94. Electrons from the plasma 98 are collected by the anode 94, the switch 56 conducts, and the anode voltage falls to the 500 V level. To open the switch 56, the control grid 96 is returned to the cathode potential or below (−400 V in the present example), thereby terminating collection of electrons from the plasma 98 by the anode 94.

Figure 7:
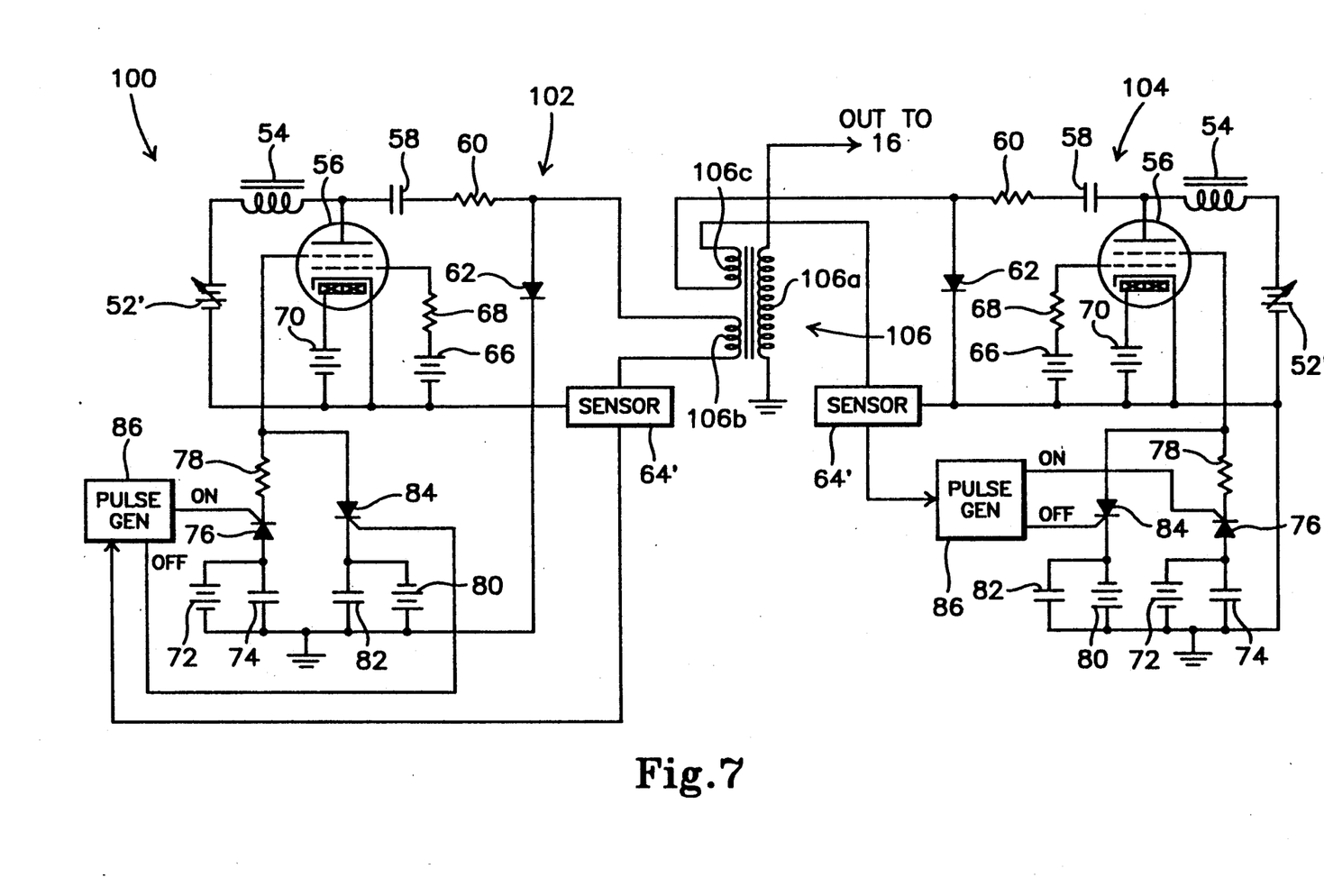
FIG. 7 is an electrical schematic diagram illustrating a bipolar pulse modulator embodying the present invention.

FIG. 7 illustrates a bipolar pulse modulator embodying the present invention which is generally designated as 100, and includes two pulse modulators 102 and 104 which are essentially similar to the modulator 50' shown in FIG. 5.

A modified pulse transformer 106 has a secondary winding 106a connected to the stage 16 and thereby the object 12, and two primary windings 106b and 106c connected to the outputs of the modulators 102 and 104 respectively. The primary winding 106b is connected to the modulator 102 in the same manner as illustrated in FIG. 5. However, the connections of the primary winding 106c to the modulator 104 are reversed. Whereas the output pulses from the modulator 102 induce negative output pulses in the secondary winding 106a as described above, the output pulses from the modulator 104 induce positive pulses in the secondary winding 106a. The modulators 102 and 104 may be operated individually to selectively apply only negative or positive pulses to the object, or in combination to apply negative pulses alternating with positive pulses.

Application of positive pulses to the object 12 causes electrons, rather than positively charged ions, to be accelerated into the object. One purpose for bombarding the object with electrons is to provide thermally assisted ion implantation as described in a paper entitled "New application for multipolar plasmas: High-temperature treatment of materials", by J. Pelletier et al, Rev. Sci. Instrum., vol. 55, no. 10, Oct. 1984, pp. 1636–1638. Other uses of electron collection by the object include surface processing operations such as target heating for surface annealing, bulk annealing, material outgassing in the vacuum system, surface cleaning, and enhancement of coating formation by temperature control. A yet further application is surface cleaning by electron induced desorption.

The power sources 52' may be made variable so that the magnitudes of the negative and positive pulses can have different values. The pulse generators 86 may also be adjusted so that the negative and positive pulses have different durations and/or waveforms.

Figure 8:
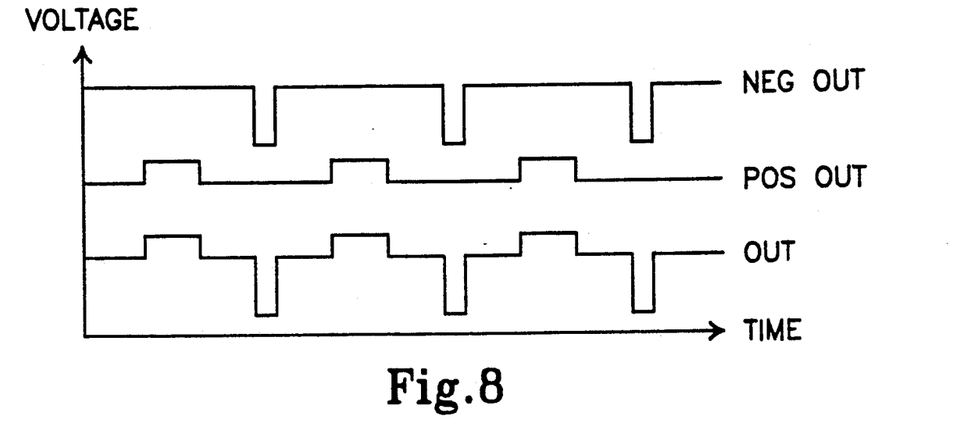
FIGS. 8 and 9 are timing diagrams illustrating the operation of the bipolar pulse modulator of FIG. 7.
Figure 9:
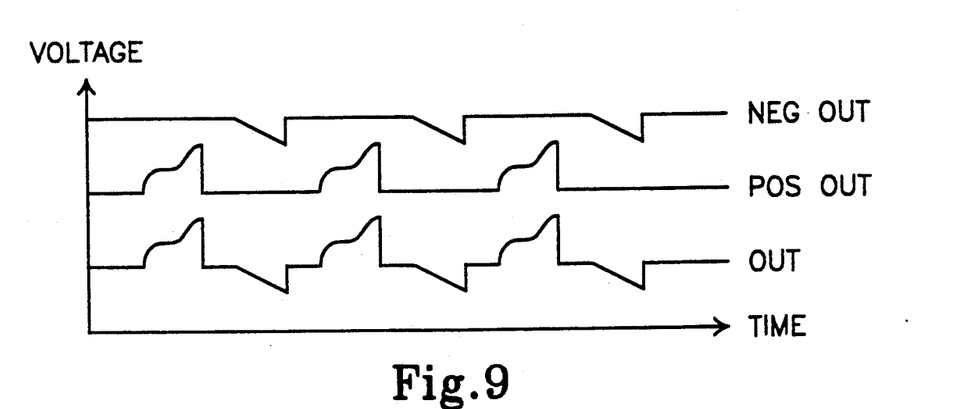

As illustrated in FIG. 8 by way of example, the negative pulses may have a shorter duration and a larger magnitude than the positive pulses. Another example is shown in FIG. 9, in which the negative pulses have a ramp shaped waveform whereas the positive pulses have a nonlinear waveform. This enables the pulses to be programmed to provide optimal implantation profiles for individual object materials.

It will be noted that the present invention may also be utilized to generate negative pulses for applications including surface cleaning by sputtering, surface modification by ion bombardment, and reactive ion deposition for target coating by alternative materials.

Figure 10:
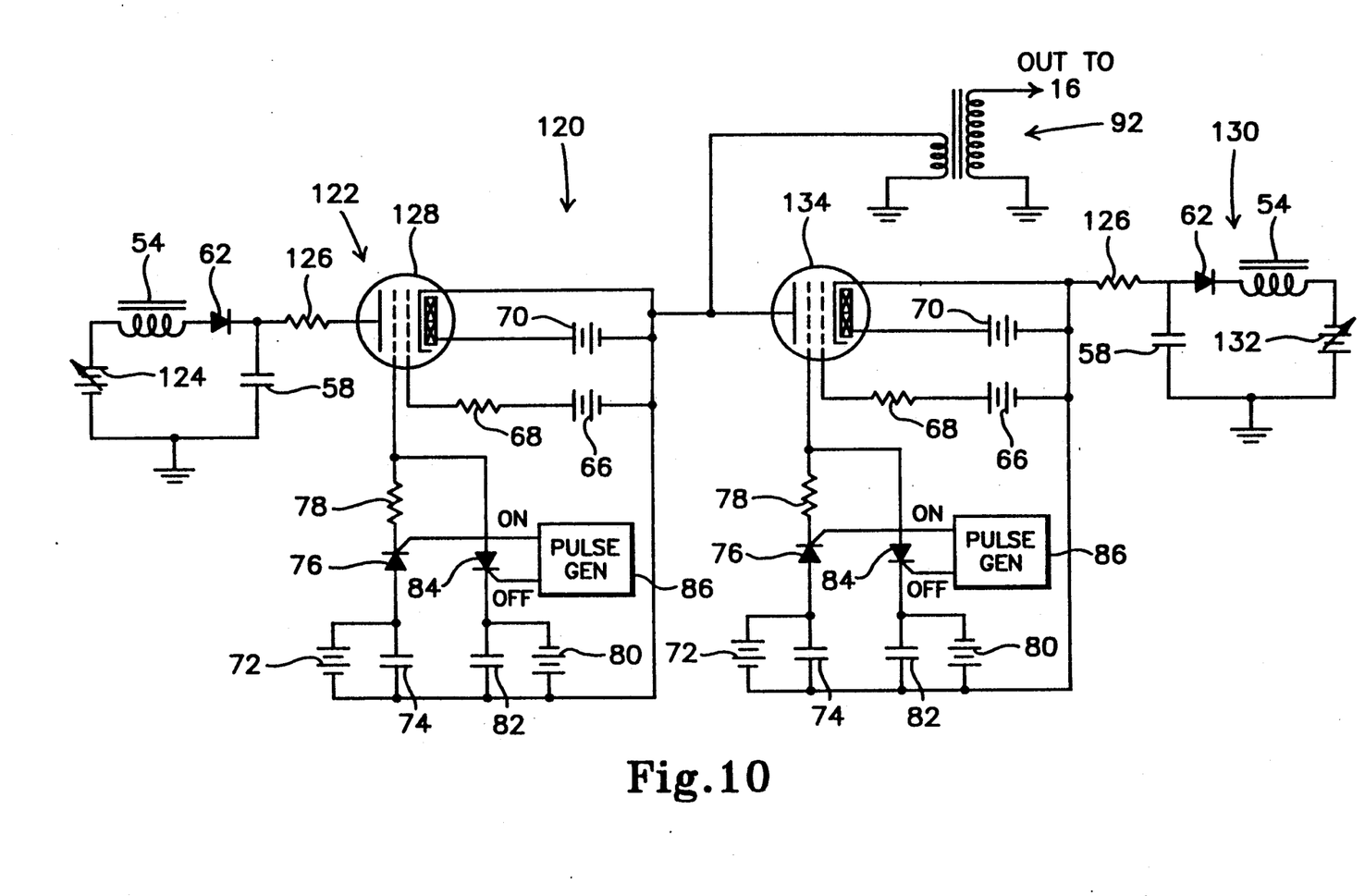
FIG. 10 is an electrical schematic diagram illustrating another bipolar pulse modulator embodying the present invention.

FIG. 10 illustrates another bipolar pulse modulator 120 embodying the present invention, with like elements again designated by the same reference numerals. The bipolar modulator 120 includes a positive pulse modulator 122 including a power source 124 having its negative end connected to ground, and its positive end connected to ground through the inductor 54, charging diode 62, and capacitor 58. The junction of the diode 62 and capacitor 58 is connected through a resistor 126 to the anode of a plasma switch 128, which may be a Hughes 8454 CROSSATRON modulator switch as described above. The cathode of the switch 128 is connected to the primary winding of the pulse transformer 92.

The bipolar modulator 120 further includes a negative pulse modulator 130 including a power source 132 and a plasma switch 134. The modulator 130 is similar to the modulator 122, except that the connections of the power source 132 and switch 134 are reversed relative to the corresponding elements in the modulator 122. It will be noted that the plasma switches 128 and 134 are electrically connected in series with the object across the respective capacitors 58.

In operation, the capacitor 58 of the modulator 122 charges positively with respect to ground during the periods between positive pulses. This occurs because the switch 128 is open during these periods, and electrically disconnects the respective capacitor 58 from the pulse transformer 92. Closing the switch 128 causes the capacitor 50 of 58 of the the modulator 122 to be electrically connected to and discharge into the primary winding of the pulse transformer 92, thereby inducing a positive pulse in the secondary winding of the transformer. The modulator 130 operates in the same manner as the modulator 122, with reversed polarity.

Although two separate plasma switches 128 and 134 are illustrated in FIG. 10, it is within the scope of the invention to replace the two switches with a single bidirectional CROSSATRON or other plasma switch (not shown). A suitable bidirectional CROSSATRON switch is disclosed in U.S. patent application Ser. No. 454,675, entitled "COMPACT HIGH VOLTAGE POWER SUPPLY", filed Dec. 2, 1989, now U.S. Pat. No. 5,008,798, issued on Apr. 16, 1991, by R. Harvey, which is assigned to the Hughes Aircraft Company, the assignee of the present application.

The bipolar modulator 100 or 120 may be operated in such a manner as to alternatingly generate positive pulses which cause plasma generation and negative pulses which cause ion implantation. The positive pulses initiate glow discharge between the walls of the chamber 14 and the object 12, thereby eliminating the necessary of providing a separate plasma generating source and associated components.

Figure 11:
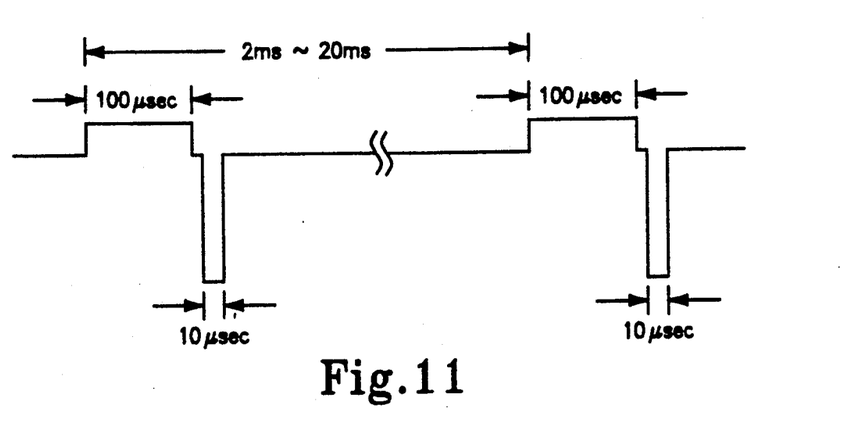
FIG. 11 is a timing diagram illustrating positive and negative pulse waveforms selected to cause plasma generation and ion implantation respectively.

The waveform, including the duration and voltage profile of the positive pulses, are selected to produce the correct plasma density, and maintain adequate plasma density after the positive pulses are terminated and the negative pulses applied to cause ions from the plasma to be accelerated into the object 12. An exemplary pulse train including positive and negative pulses having waveforms selected to accomplish this operation is illustrated in FIG. 11. The pulse train includes +10 kV, 100 microsecond pulses for plasma generation, followed closely by −100 kV, 10 microsecond pulses for ion implantation. The pulse repetition frequency may typically vary between approximately 50 Hz to 500 Hz.

Figure 12:
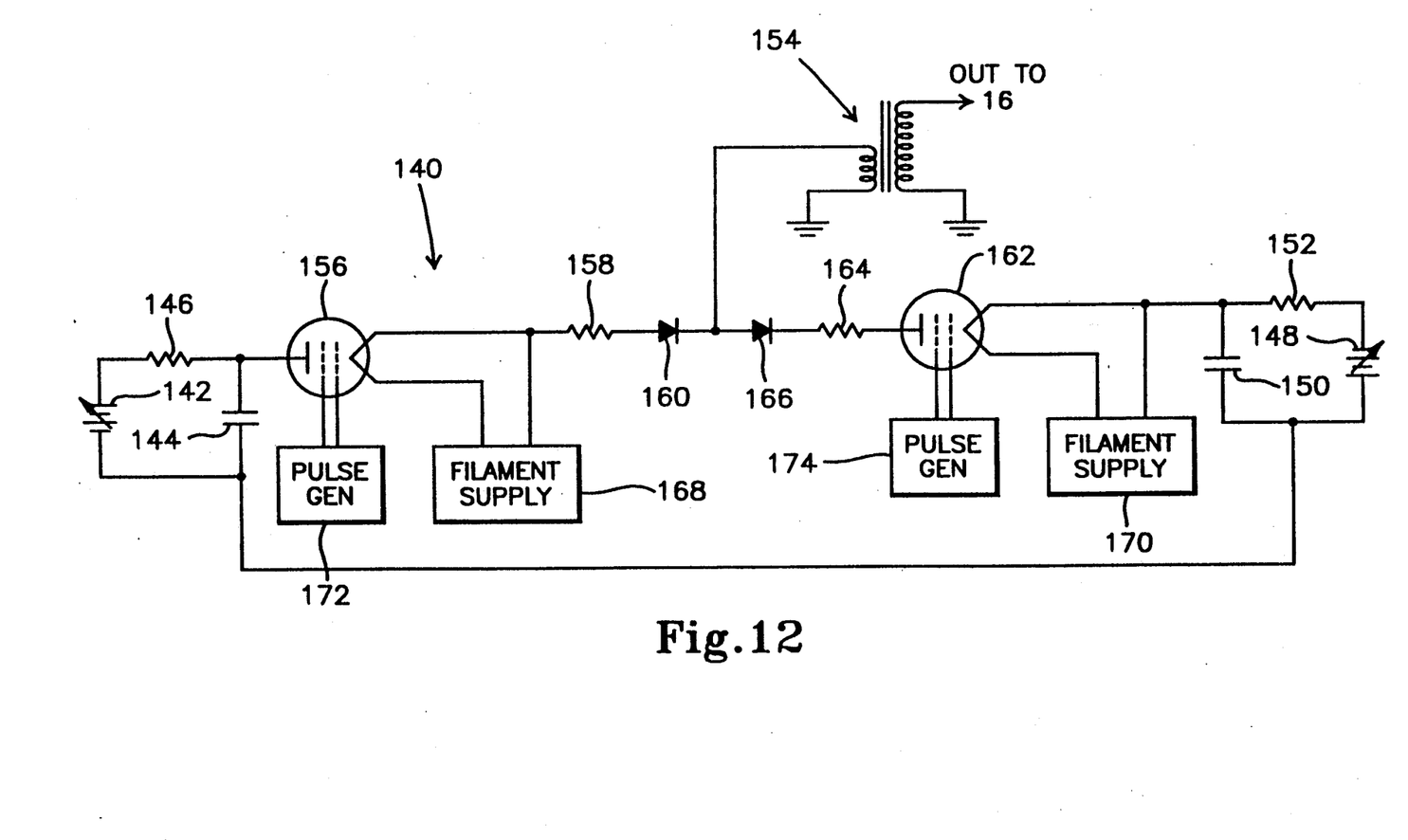
FIG. 12 is an electrical schematic diagram of an alternative bipolar pulse modulator embodying the present invention utilizing vacuum tube switches.

The bipolar operations described above may alternatively be performed using thyratron or other plasma switches, or with other types of switches such as vacuum tube switches as illustrated in FIG. 12. Assuming that the bipolar plasma generation and implantation operations described with reference to FIG. 11 are to be performed, a bipolar pulse modulator 140 may include a positive power source 142 for supplying a positive voltage or potential of +5 kV. A capacitor 144 charges positively from the source 142 through a resistor 146. A power source 148 supplies a negative potential of −50 kV to charge a capacitor 150 through a resistor 152.

The capacitor 144 is connected to the primary winding of a pulse transformer 154 through a tetrode Vacuum tube 156, resistor 158 and diode 160. The capacitor 150 is similarly connected to the primary winding of the pulse transformer 154 through a vacuum tube 162, resistor 164 and diode 166. The vacuum tubes 156 and 162 are configured to function as switches, and have maximum voltage ratings on the order of 50 kV. Further illustrated are filament voltage supplies 168 and 170 for the vacuum tubes 156 and 162 respectively.

In response to trigger pulses from a pulse generator 172, the tube 156 is turned on to connect the capacitor 144 to the pulse transformer 154 for 100 microseconds and thereby apply the positive +10 kV pulse to the object 12. Then, the tube 156 is turned off and the tube 162 is turned on for 10 microseconds to connect the capacitor 150 to the pulse transformer 154 and thereby apply the negative −100 kV pulse to the object 12.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. An ion implantation apparatus comprising:
   a container for enclosing an object to be implanted;
   plasma generator means for generating a plasma which surrounds the object in the container; and
   a pulse modulator for applying first electrical pulses to the object which cause ions to be accelerated from the plasma toward and be implanted into the object and second electrical pulses to the object which cause electrons to be accelerated into the object, the pulse modulator including:
   first power source means for generating a first electrical potential;
   first capacitor means connected in circuit with the first power source means for charging therefrom;
   first plasma switch means connected in circuit for causing the first capacitor means to periodically discharge into and thereby apply the first electrical pulses to the object;
   the first power source means, first capacitor means and first plasma switch means being connected in circuit to apply the first electrical pulses to the object with a negative polarity;
   second power source means for generating a second electrical potential;
   second capacitor means connected in circuit with the second power source mans for charging therefrom; and
   second plasma switch means connected in circuit for causing the second capacitor means to periodically discharge into the object and thereby apply the second electrical pulses to the object;
   the second power source means, second capacitor means and second plasma switch means being connected in circuit to apply the second electrical pulses to the object with a positive polarity.

2. An apparatus as in claim 1, in which:
   the first capacitor means is connected in parallel circuit with the first power source means;
   the first plasma switch means is connected in series circuit with the object across the first power source means;
   the second capacitor means is connected in parallel circuit with the second power source means; and
   the second plasma switch means is connected in series circuit with the object across the second power source means.

3. An apparatus as in claim 1, in which the first plasma switch means is constructed to periodically connect a negatively charged end of the first capacitor means in circuit to the object; and the second plasma switch means is provided to periodically connect a positively charged end of the second capacitor means in circuit to the object.

4. An apparatus as in claim 3, in which the first plasma switch means comprises a first cold cathode, crossed-magnetic-field modulator switch having a cathode connected in circuit to a negative end of the first power source means, and an anode connected in series to the object; and the second plasma switch means comprises a second cold cathode, crossed-magnetic-field modulator switch having an anode connected in circuit to a positive end of the second power source means, and a cathode connected in series to the object.

5. An apparatus as in claim 1, in which:
   the first plasma switch means is connected in parallel circuit with the first power source means;
   the first capacitor means is connected in series circuit with the object across the first plasma switch means;
   the second plasma switch means is connected in parallel circuit with the second power source means; and
   the second capacitor means is connected in series circuit with the object across the second plasma switch means.

6. An apparatus as in claim 5 further including a pulse transformer means having a secondary winding and first and second primary windings, wherein the first and second primary windings are connected respectively to the output of a first circuit comprising the first power source means, first capacitor means and first plasma switch means connected in circuit and the output of a second circuit comprising the second power source means, second capacitor means and second plasma switch means connected in circuit, such that the pulses induced in the secondary winding respectively by the outputs of said first and second circuits have opposite polarity.

7. An apparatus as in claim 1, further comprising pulse transformer means connected in circuit between the first capacitor means and the object and between the second capacitor means and the object for stepping up the voltage of the electrical pulses applied to the object.

8. An apparatus as in claim 1, further comprising:
arc detector means for detecting an imminent arcing condition between the object and the plasma; and
arc suppression means responsive to the arc detector means for controlling the first and second plasma switch means to terminate said discharge of the first and second capacitor means into the object in response to detection of said imminent arcing condition.

9. An apparatus as in claim 8, in which the arc detector means comprises current sensor means for detecting flow of current from the first and second capacitor means into the object above a level which is predetermined to correspond to said imminent arcing condition.

10. An apparatus as in claim 8, in which:
the first and second plasma switch means are connected in circuit to close and thereby cause the first and second capacitor means to discharge into the object; and
the arc suppressing means is constructed to cause the first and second plasma switch means to open in response to detection of said imminent arcing condition.

11. An apparatus as in claim 10, in which the first and second plasma switch means each comprises a cold cathode, crossed-magnetic-field modulator switch.

12. An apparatus as in claim 1, in which the second power source means, second capacitor means and second plasma switch means are provided to apply the second electrical pulses having the positive polarity to the object in alternation with the first electrical pulses having the negative polarity.

13. An apparatus as in claim 1, in which the first and second plasma switch means comprise first and second cold cathode, crossed-magnetic-field modulator switches respectively.

14. An apparatus as in claim 1, in which the first and second plasma switch means each comprise;
a plasma switch; and
control means for individually controlling the opening and closing times of the respective plasma switch.

15. A pulse modulator for applying electrical pulses to an object for implantation with ions from a plasma in a plasma source ion implantation apparatus, comprising:
first power source means for generating a first electrical potential;
first capacitor means connected in circuit with the first power source means for charging therefrom;
first plasma switch means connected in circuit for causing the first capacitor means to periodically discharge into and thereby apply first electrical pulses to the object;
the first power source means, first capacitor means and first plasma switch means being connected in circuit to apply the first electrical pulses to the object with a negative polarity;
second power source means for generating a second electrical potential;
second capacitor means connected in circuit with the second power source means for charging therefrom; and
second plasma switch means connected in circuit for causing the second capacitor means to periodically discharge into the object and thereby apply second electrical pulses to the object;
the second power source means, second capacitor means and second plasma switch means being connected in circuit to apply the second electrical pulses to the object with a positive polarity.

16. A pulse modulator as in claim 15, in which:
the first capacitor means is connected in parallel circuit with the first power source means;
the first plasma switch means is connected in series circuit with the object across the first power source means;
the second capacitor means is connected in parallel circuit with the second power source means; and
the second plasma switch means is connected in series circuit with the object across the second power source means.

17. A pulse modulator as in claim 15, in which the first plasma switch means is constructed to periodically connect a negatively charged end of the first capacitor means in circuit to the object; and the second plasma switch means is constructed to periodically connect a positively charged end of the second capacitor means in circuit to the object.

18. A pulse modulator as in claim 17, in which the first plasma switch means comprises a first cold cathode, crossed-magnetic-field modulator switch having a cathode connected in circuit to a negative end of the first power source means, and an anode connected in series to the object; and the second plasma switch means comprises a second cold cathode, crossed-magnetic-field modulator switch having an anode connected in circuit to a positive end of the second power source means, and a cathode connected in series to the object.

19. A pulse modulator as in claim 15, in which:
the first plasma switch means is connected in parallel circuit with the first power source means;
the first capacitor means is connected in series circuit with the object across the first plasma switch means;
the second plasma switch means is connected in parallel circuit with the second power source means; and
the second capacitor means is connected in series circuit with the object across the second plasma switch means.

20. A pulse modulator as in claim 19, further including a pulse transformer means having a secondary winding and first and second primary windings, wherein the first and second primary windings are connected respectively to the output of a first circuit comprising the first power source means, first capacitor means and first plasma switch means connected in circuit and the output of a second circuit comprising the second power source means, second capacitor means and second plasma switch means connected in circuit such that the pulses induced in the secondary winding respectively by the outputs of said first and second circuits have opposite polarity.

21. A pulse modulator as in claim 15, further comprising pulse transformer means connected in circuit between the first capacitor means and the object and between the second capacitor means and the object for stepping up the voltage of the electrical pulses applied to the object.

22. A pulse modulator as in claim 15, further comprising:
arc detector means for detecting an imminent arcing condition between the object and the plasma; and
arc suppressing means responsive to the arc detector means for controlling the first and second plasma switch means to terminate said discharge of the first and second capacitor means into the object in response to detection of said imminent arcing condition.

23. A pulse modulator as in claim 22, in which the arc detector means comprises current sensor means for detecting flow of current from the first and second capacitor means into the object above a level which is predetermined to correspond to said imminent arcing condition.

24. A pulse modulator as in claim 22, in which:
the first and second plasma switch means are connected in circuit to close and thereby cause the first and second capacitor means to discharge into the object; and
the arc suppression means is constructed to cause the first and second plasma switch means to open in response to detection of said imminent arcing condition.

25. A pulse modulator as in claim 24, in which the first and second plasma switch means each comprises a cold cathode, cross-magnetic-field modulator switch.

26. A pulse modulator as in claim 15, in which the second power source means, second capacitor means and second plasma switch means are provided to apply the second electrical pulses having the positive polarity to the object in alternation with the first electrical pulses having the negative polarity.

27. A pulse modulator as in claim 15, in which the first and second plasma switch means comprise first and second cold cathode, crossed-magnetic-field modulator switches respectively.

28. A pulse modulator as in claim 15, in which the first and second plasma switch means each comprise;
a plasma switch; and
control means for individually controlling the opening and closing times of the respective plasma switch.

29. A bipolar pulse modulator for individually applying electric pulses to an object for implantation with ions or for surface processing with electrons from a plasma in a plasma source ion implantation apparatus, comprising:
negative power source means;
first switch means connected in circuit for periodically electrically connecting the negative power source means to the object so that negative pulses are applied to the object;
positive power source means; and
second switch means connected in circuit for periodically electrically connecting the positive power source means to the object so that positive pulses are applied to the object during periods when the negative power source means is not connected to the object.

30. A bipolar pulse modulator as in claim 29, in which the first and second switch means comprise first and second vacuum tube switches respectively.

31. A bipolar pulse modulator as in claim 29, in which the first and second switch means each comprise;
a vacuum tube switch; and
control means for individually controlling the opening and closing times of the respective vacuum tube switch.

32. A bipolar pulse modulator as in claim 29, in which:
the negative and positive power source means comprise first and second capacitor means respectively; and
the first and second switch means are connected in circuit to close and thereby cause the first and second capacitor means respectively to discharge into the object.

33. A bipolar pulse modulator as in claim 29, in which:
the first switch means comprises a first vacuum tube switch having a cathode connected in circuit to the negative power source means and an anode connected in circuit to the object; and
the second switch means comprises a second vacuum tube switch having an anode connected in circuit to the positive power source means and a cathode connected in circuit to the object.

34. A bipolar pulse modulator for individually applying electric pulses to an object for implantation with ions or for surface processing with electrons for a plasma in a plasma source ion implantation apparatus, comprising:
negative power source means;
first switch means connected in circuit for periodically electrically connecting the negative power source means to the object so that negative pulses are applied to the object;
positive power source means; and
second switch means connected in circuit for periodically electrically connecting the positive power source means to the object so that positive pulses are applied to the object during periods when the negative power source means is not connected to the object, and
further comprising pulse transformer means connected in circuit between the negative and positive power source means and the object for stepping up the voltage of the negative and positive electrical pulses applied to the object respectively.

35. A bipolar pulse modulator as in claim 29, further comprising control means for controlling the first and second switch means to alternately connect the negative and positive power source means to the object.

36. A method of applying electrical pulses to an object for surface processing with electrons or implantation with ions from a plasma in a plasma source ion implantation apparatus, comprising:
providing negative power source means;
periodically applying negative pulses to the object using a first switch connected to the negative power source means to implant ions into the object;
providing positive power source means; and
applying positive pulses to the object using a second switch connected to the positive power source means to periodically apply the positive pulses alternating with and between the negative pulses to accelerate electrons into the object.

37. A method as in claim 36, comprising applying the negative pulses having a waveform selected to cause ions from the plasma to be implanted into the object.

38. A method as in claim 37, comprising applying the positive pulses having a waveform selected to cause generation of the plasma.

39. An ion implantation apparatus comprising:
a container for enclosing an object to be implanted;
plasma generator means for generating a plasma which surrounds the object in the container; and
a pulse modulator for applying positive electrical pulses to the object which cause electrons to be accelerated from the plasma into the object, the pulse modulator including:
power source means for generating an electrical potential;
capacitor means connected in circuit with the power source means for charging therefrom; and
plasma switch means connected in circuit for causing the capacitor means to periodically discharge into and thereby apply said positive electrical pulses into the object, and
further comprising pulse transformer means connected in circuit between the capacitor means and the object for stepping up the voltage of the electrical pulses applied to the object.

* * * * *